US011018140B2

(12) United States Patent
Chien et al.

(10) Patent No.: US 11,018,140 B2
(45) Date of Patent: May 25, 2021

(54) SEMICONDUCTOR DEVICE AND METHOD FOR MANUFACTURING THE SAME

(71) Applicant: Winbond Electronics Corp., Taichung (TW)

(72) Inventors: Yi-Hao Chien, Taichung (TW); Kazuaki Takesako, Taichung (TW); Kai Jen, Taichung (TW); Hung-Yu Wei, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/389,322

(22) Filed: Apr. 19, 2019

(65) Prior Publication Data

US 2020/0335506 A1 Oct. 22, 2020

(51) Int. Cl.
*H01L 27/108* (2006.01)
*H01L 21/764* (2006.01)

(52) U.S. Cl.
CPC ...... *H01L 27/10885* (2013.01); *H01L 21/764* (2013.01); *H01L 27/1087* (2013.01); *H01L 27/10829* (2013.01); *H01L 27/10888* (2013.01)

(58) Field of Classification Search
CPC ......... H01L 27/10885; H01L 27/10829; H01L 27/1087; H01L 27/10888
See application file for complete search history.

(56) References Cited

U.S. PATENT DOCUMENTS

| 7,579,233 | B2 | 8/2009 | Hwang | |
|---|---|---|---|---|
| 8,999,837 | B2 | 4/2015 | Park et al. | |
| 9,165,898 | B2 | 10/2015 | Kameyama et al. | |
| 9,202,774 | B2 | 12/2015 | Yeom et al. | |
| 9,356,073 | B1* | 5/2016 | Kim | H01L 21/76805 |
| 9,627,316 | B1* | 4/2017 | Chang | H01L 23/5226 |
| 2012/0305999 | A1 | 12/2012 | Okonogi | |
| 2014/0299989 | A1* | 10/2014 | Lim | H01L 23/48 257/751 |
| 2015/0014759 | A1* | 1/2015 | Lee | H01L 23/53266 257/306 |
| 2015/0035050 | A1* | 2/2015 | Yeom | H01L 21/76897 257/330 |
| 2018/0350932 | A1* | 12/2018 | Liu | H01L 29/66439 |
| 2020/0105867 | A1* | 4/2020 | Lee | H01L 21/823475 |

FOREIGN PATENT DOCUMENTS

TW 201816856 A 5/2018

\* cited by examiner

*Primary Examiner* — Joseph M Galvin, III
(74) *Attorney, Agent, or Firm* — Muncy, Geissler, Olds & Lowe, P.C.

(57) ABSTRACT

A semiconductor device and a manufacturing method of the same are provided. The method includes forming a plurality of first conductive structures and a first dielectric layer between the first conductive structures on a substrate. The method also includes forming a trench between the first dielectric layer and the first conductive structures. The method further includes forming a liner material on a sidewall and a bottom of the trench. In addition, the method includes forming a conductive plug on the liner material in the trench. The method also includes removing the liner material to form an air gap, and the air gap is located between the conductive plug and the first dielectric layer.

20 Claims, 18 Drawing Sheets

12

SEMICONDUCTOR DEVICE AND METHOD FOR MANUFACTURING THE SAME

BACKGROUND

Technical Field

The present disclosure relates to a semiconductor device and a manufacturing method of the same, and particularly to a semiconductor device used in a dynamic random access memory (DRAM) and a manufacturing method of the same.

Description of the Related Art

In current dynamic random access memory (DRAM) structures, capacitors are bridged by capacitor contacts, and bit lines are arranged adjacent to the capacitor contacts. There are many factors that may influence the parasitic capacitance of the bit lines, but the parasitic capacitance mainly comes from the bit line-capacitor contact capacitance (BL-CC capacitance) between the bit lines and the capacitor contacts. However, as processing sizes keep decreasing, the distances between the bit lines and the capacitor contacts in DRAMs become shorter and shorter. In addition, as the capacitance requirements of DRAMs become larger, the lengths of the bit lines likewise become longer as well. These factors will all cause an increase in parasitic capacitance of the bit lines and further reduce the capacitance amplification signals.

Therefore, the industry needs a semiconductor device with reduced parasitic capacitance of bit lines and a manufacturing method thereof.

BRIEF SUMMARY

In accordance with some embodiments of the present disclosure, a manufacturing method of a semiconductor device is provided. The manufacturing method of the semiconductor device includes forming a first dielectric layer and a plurality of first conductive structures on a substrate, and the first dielectric layer is located between the first conductive structures. The manufacturing method of the semiconductor device also includes forming a trench in the first dielectric layer and between the first conductive structures. The manufacturing method of the semiconductor device further includes forming a liner material on a sidewall and a bottom of the trench, and forming a conductive plug on the liner material in the trench. The manufacturing method of the semiconductor device further includes removing the liner material to form an air gap, and the air gap is located between the conductive plug and the first dielectric layer.

In accordance with some embodiments of the present disclosure, a semiconductor device is provided. The semiconductor device includes a plurality of first conductive structures and a second conductive structure, the first conductive structures are disposed on a substrate, and the second conductive structure is disposed on the substrate and located between the first conductive structures. The second conductive structure includes an ohmic contact layer, a conductive plug, a metal liner layer, and an air gap. The conductive plug is located on the ohmic contact layer. The air gap is located on the ohmic contact layer and on a sidewall of the conductive plug. The metal liner layer is located between the ohmic contact layer and the air gap and located on the sidewall of the conductive plug.

BRIEF DESCRIPTION OF THE DRAWINGS

The disclosure will be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

The following embodiments of the present disclosure are described with the accompanying figures to more fully illustrate the embodiments of the present disclosure. However, the embodiments of the present disclosure may also be implemented in various ways, and should not be limited to the embodiments illustrated herein. The layers and the thicknesses of areas in figures may be scaled up for clarity, and the same or similar reference numbers in various figures may represent the same or similar components.

Figure 1:
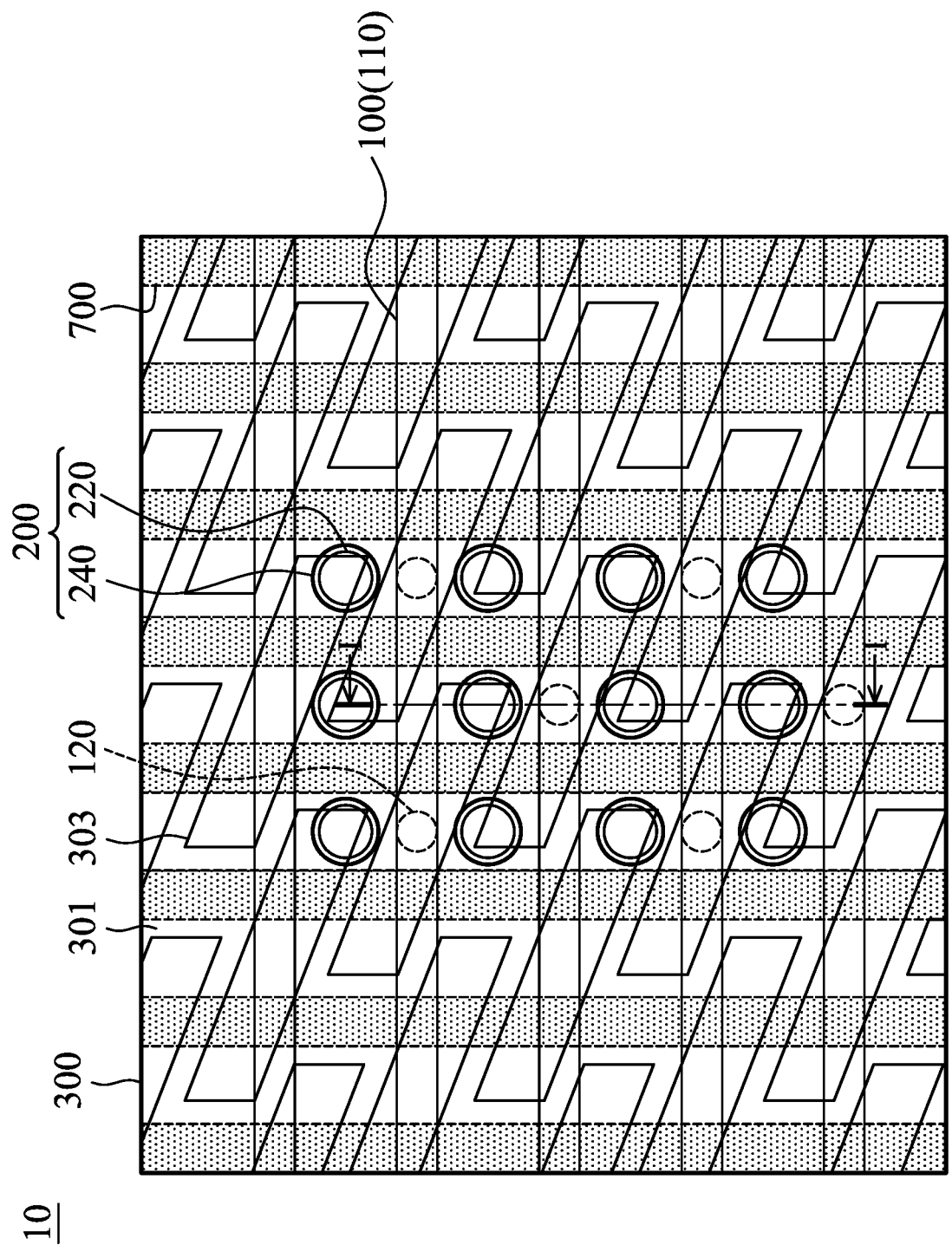
FIG. 1 is a top view of a semiconductor device in accordance with some embodiments of the present disclosure.
Figure 2:
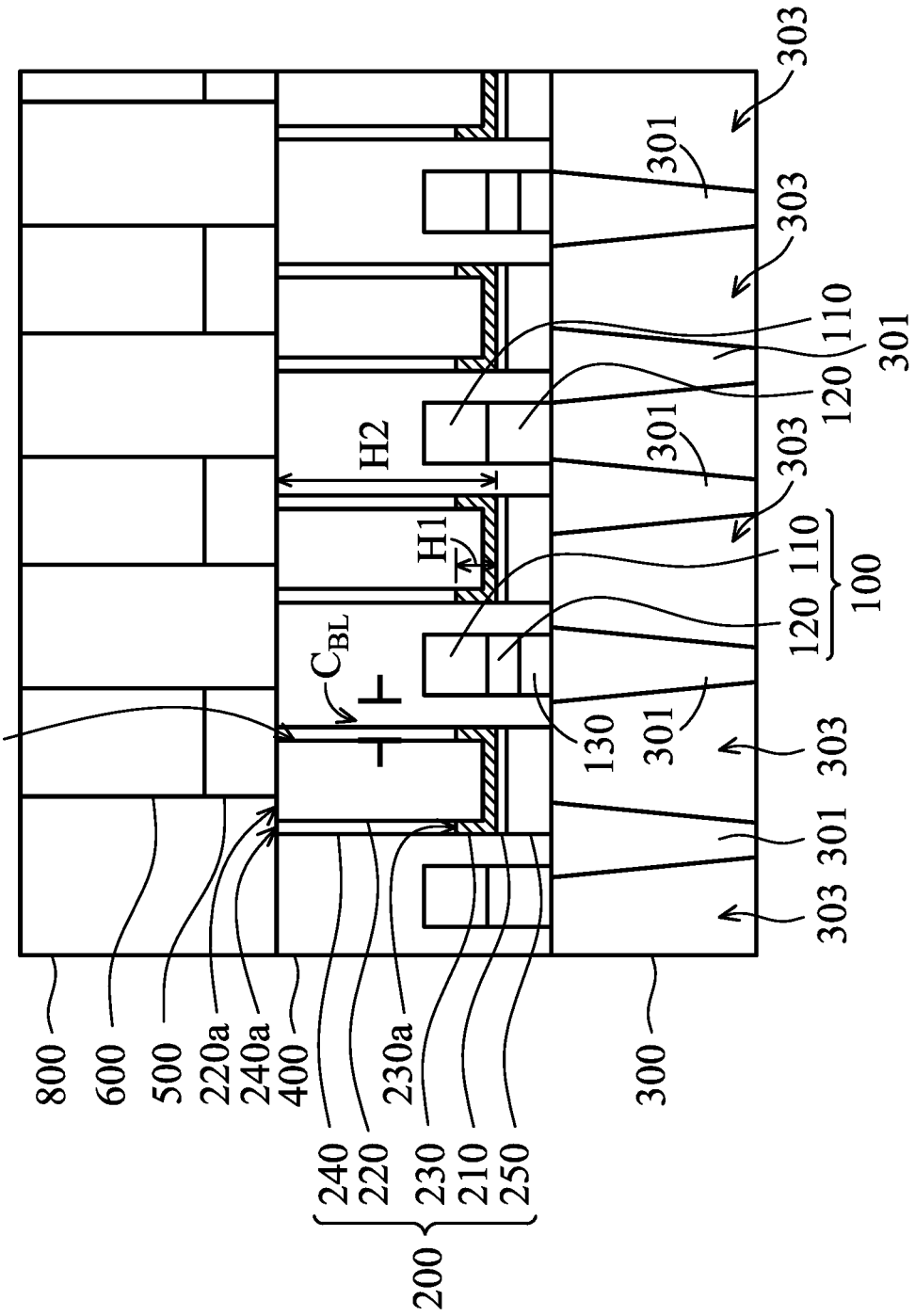
FIG. 2 is a cross-sectional view of a semiconductor device along the cross-sectional line I-I in FIG. 1 in accordance with some embodiments of the present disclosure.

FIG. 1 is a top view of a semiconductor device 10 in accordance with some embodiments of the present disclosure, and FIG. 2 is a cross-sectional view of the semiconductor device 10 along the cross-sectional line I-I in FIG. 1 in accordance with some embodiments of the present disclosure.

As shown in FIGS. 1 and 2, the semiconductor device 10 includes a plurality of first conductive structures 100 and a second conductive structure 200. The first conductive structures 100 are disposed on a substrate 300, and the second conductive structure 200 is disposed on the substrate 300 and located between the first conductive structures 100. The second conductive structure 200 includes an ohmic contact layer 210, a conductive plug 220, a metal liner layer 230, and an air gap 240. The conductive plug 220 is located on the ohmic contact layer 210. The air gap 240 is located on the ohmic contact layer 210 and on a sidewall 220S of the conductive plug 220. The metal liner layer 230 is located between the ohmic contact layer 210 and the air gap 240 and located on the sidewall 220S of the conductive plug 220.

As shown in FIG. 2, the air gap 240 may be, for example, in direct contact with the conductive plug 220, and the air gap 240 may be, for example, in direct contact with the conductive plug 220.

As shown in FIG. 1, the semiconductor device 10 may further include a plurality of third conductive structures 700. The third conductive structures 700 and the first conductive structures 100 are arranged as extending along directions that are perpendicular to each other as viewed from a top view perspective. In some embodiments, the first conductive structures 100 may be bit line structures, the second conductive structure 200 may be a capacitor contact structure, and the third conductive structures 700 may be embedded word line structures. In this regard, the semiconductor device 10 may be a dynamic random access memory (DRAM) structure.

The semiconductor device 10 may further include an isolation structure 301 formed in the substrate 300. The isolation structure 301 defines a plurality of active regions 303 in the substrate 300.

In some embodiments, the substrate 300 may further include a semiconductor substrate, such as a silicon substrate or a silicon germanium (SiGe) substrate, and the isolation structure 301 may include a shallow trench isolation (STI) structure.

In some embodiments, each of the first conductive structures 100 may include a conductive structure 110 (e.g., bit line) and a conductive contact 120 (e.g., bit line contact), and the conductive contact 120 is located between the active region 303 and the conductive structure 110. In some embodiments, the conductive structure 110 and the conductive contact 120 may be made of, for example, polysilicon, metal, or other suitable conductive materials, respectively.

As shown in FIG. 2, the semiconductor device 10 may further include a plurality of insulating layers 130, and the insulating layers 130 are located between the isolation structures 301 and some of the conductive contacts 120. In some embodiments, the insulating layers 130 may be made of, for example, silicon oxide or other suitable insulating materials. It is to be noted that, in order to simplify and clearly describe the embodiments of the present disclosure, only the conductive contacts 120 that are connected to the active regions 303 are shown in FIG. 1, and the other conductive contacts 120 that are disposed on the insulating layers 130 are omitted.

The second conductive structure 200 may further include a conductive layer 250, and the conductive layer 250 is formed between the ohmic contact layer 210 and the substrate 300. In some embodiments, the conductive layer 250 may include a conductive material and is, for example, a polysilicon layer.

In some embodiments, the ohmic contact layer 210 may include metal silicide, such as cobalt silicide ($CoSi_x$, wherein x is less than or equal to 2). The ohmic contact layer 210 is, for example, a cobalt silicide layer, and it can be used for reducing the resistance between the conductive layer 250 and the conductive plug 220.

In some embodiments, the conductive plug 220 may include metal. For example, the conductive plug 220 may include tungsten, other suitable metal materials, or any combinations thereof.

In some embodiments, the metal liner layer 230 may include metal or metal nitride. For example, the metal liner layer 230 may include titanium, titanium nitride, tantalum, tantalum nitride, or any combinations thereof.

In some embodiments, the metal liner layer 230 is disposed between the ohmic contact layer 220 and the air gap 240, and is can separate the air gap 240 and the ohmic contact layer 220 from each other. As such, the metal liner layer 230 is not only advantageous to the growth of the metal material of the conductive plug 220, but it also can protect the ohmic contact layer 220 from damage caused by subsequent etching processes and/or cleaning processes in the manufacturing process of the semiconductor device.

In some embodiments, a top surface 230a of the metal liner layer 230 may be lower than a top surface 220a of the conductive plug 220. In some embodiments, the top surface 230a of the metal liner layer 230 may be exposed to the air gap 240, and a top end 240a of the air gap 240 may be substantially coplanar with the top surface 220a of the conductive plug 220. Specifically, the air gap 240 may be stacked over the metal liner layer 230, and the stacked air gap 240 and the metal liner layer 230 in combined may surround and cover the sidewall of the conductive plug 220.

In some embodiments, the total height H2 of the metal liner layer 230 and the air gap 240 may be, for example, substantially equal to a height of the conductive plug 220. In some embodiments, the height H1 of the metal liner layer 230 is lower than the total height H2 of the metal liner layer 230 and the air gap 240. As such, the air gap 240 having a low dielectric constant and that is stacked above the metal liner layer 230 can be advantageous to effectively reducing the parasitic capacitance $C_{BL}$ between the second conductive structure 200 and an adjacent first conductive structure 100.

The semiconductor device 10 may further include a first dielectric layer 400 disposed on the substrate 300. In some embodiments, the first dielectric layer 400 may include nitride. The first dielectric layer 400 may be, for example, a silicon nitride layer.

The first dielectric layer 400 may be located between the first conductive structures 100 and the second conductive structure 200, and the air gap 240 may be located between the conductive plug 220 and the first dielectric layer 400. In some embodiments, the air gap 240 may be located between the conductive plug 220 of the second conductive structure 200 and the first conductive structures 100, such that the parasitic capacitance $C_{BL}$ between the second conductive structure 200 and an adjacent first conductive structure 100 can be effectively reduced.

More specifically, the value of capacitance is proportional to the dielectric constant of a medium ($C=\varepsilon A/d$, wherein C is the value of capacitance, $\varepsilon$ is the dielectric constant of a medium, A is a surface area, and d is the thickness of the medium). The first dielectric layer 400 and the air gap 240 of the second conductive structure 200 are located between the conductive plug 220 of the second conductive structure 200 and the conductive structure 110 of the first conductive structure 100. As such, the combination of the air gap 240 and the first dielectric layer 400 forms the medium between two conductive structures. The low dielectric constant of the air gap 240 (e.g., the dielectric constant $\varepsilon_{air}$ of air is 1.0006) makes the equivalent dielectric constant of the medium be lower than the dielectric constant of the first dielectric layer 400 itself. Specifically, the air gap 240 having a low dielectric constant is advantageous to further reducing the parasitic capacitance, which is originally caused merely by the relatively high dielectric constant (e.g., the dielectric constant $\varepsilon_{SiN}$ of silicon nitride is 7) of the first dielectric layer 400, between the two conductive structures.

The semiconductor device 10 may further include a conductive connection layer 500 and a capacitor component 600. The conductive connection layer 500 may be disposed on the conductive plug 220 and the air gap 240, and the capacitor component 600 may be disposed on the conductive connection layer 500.

The semiconductor device 10 may further include a second dielectric layer 800. The second dielectric layer 800 may be disposed on the first dielectric layer 400, and the conductive connection layer 500 and the capacitor component 600 may be formed in the second dielectric layer 800. In some embodiments, the second dielectric layer 800 may include silicon oxide, silicon nitride, or the combination thereof.

Figure 3:
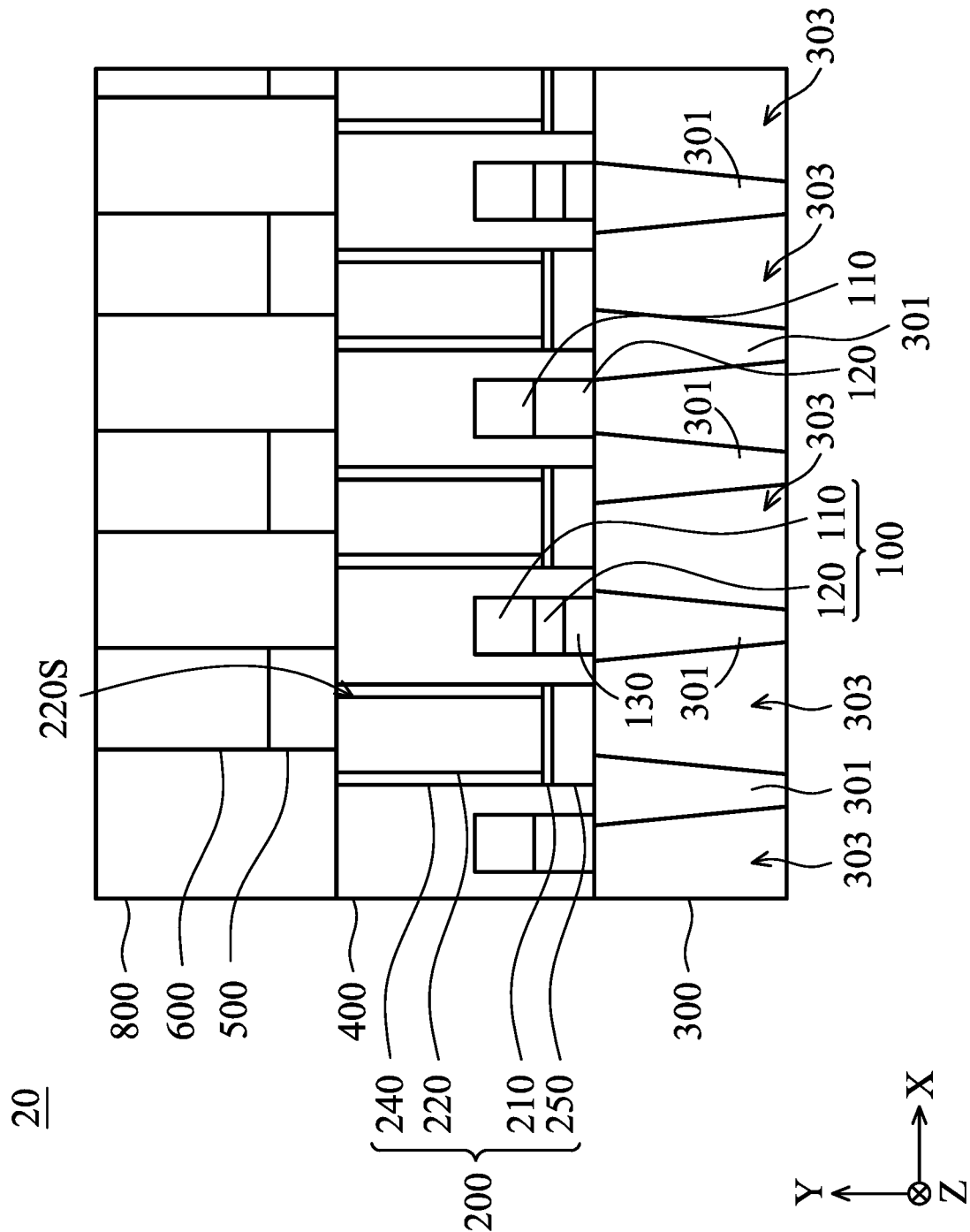
FIG. 3 is a cross-sectional view of a semiconductor device in accordance with some other embodiments of the present disclosure.

FIG. 3 is a cross-sectional view of a semiconductor device 20 in accordance with some other embodiments of the present disclosure. The top view structure of the semiconductor device 20 is similar to the structure as shown in FIG.

1, and the cross-sectional view of the semiconductor device 20 as shown in FIG. 3 may be regarded as taken along the cross-sectional line I-I in FIG. 1. Except for those indicated otherwise, components in the embodiments as shown in FIG. 3 similar to those in previous embodiments adopt the same reference numbers, and may be formed of similar materials and by similar processes, thus the detailed are not repeated herein.

According to some other embodiments, the semiconductor device 20 as shown in FIG. 3 has a structure similar to that as shown in FIG. 2, and the difference is in that the second conductive structure 200 of the semiconductor device 20 does not include a metal liner layer. The air gap 240 surrounds and covers the sidewall of the conductive plug 220, and the air gap 240 is connected to the ohmic contact layer 210 located below. As such, the air gap 240 having a low dielectric constant is advantageous to further effectively reducing the parasitic capacitance $C_{BL}$, which is originally caused merely by the relatively high dielectric constant of the first dielectric layer 400, between the first conductive structure 100 and the second conductive structure 200.

The embodiments of the present disclosure further provide a manufacturing method of a semiconductor device. FIGS. 4A-4M are cross-sectional views illustrating various stages of manufacturing the semiconductor device 20 in accordance with some embodiments of the present disclosure. Except for those indicated otherwise, components in the following embodiments similar to those in previous embodiments adopt the same reference numbers, and the detailed are not repeated herein.

Please refer to FIG. 4, a first dielectric layer 400 and a plurality of first conductive structures 100 are formed on a substrate 300, and the first dielectric layer 400 is located between the first conductive structures 100. First, a dielectric layer (not shown) may be formed on the substrate 300, and trenches (not shown) are formed by, for example, etching processes in the dielectric layer. Bottoms of some of the trenches expose, for example, the top surfaces of the active regions 303 of the substrate 300, while bottoms of some other trenches expose, for example, the top surfaces of the isolation structures 301 of the substrate 300.

Next, insulating layers 130 are formed in some trenches that expose the top surfaces of the isolation structures 301, and then conductive contacts 120 are formed on the insulating layers 130 in the trenches and on the top surfaces of the active regions 303 in some other trenches. Then, conductive structures 110 are formed on the conductive contacts 120.

Figure 4A:
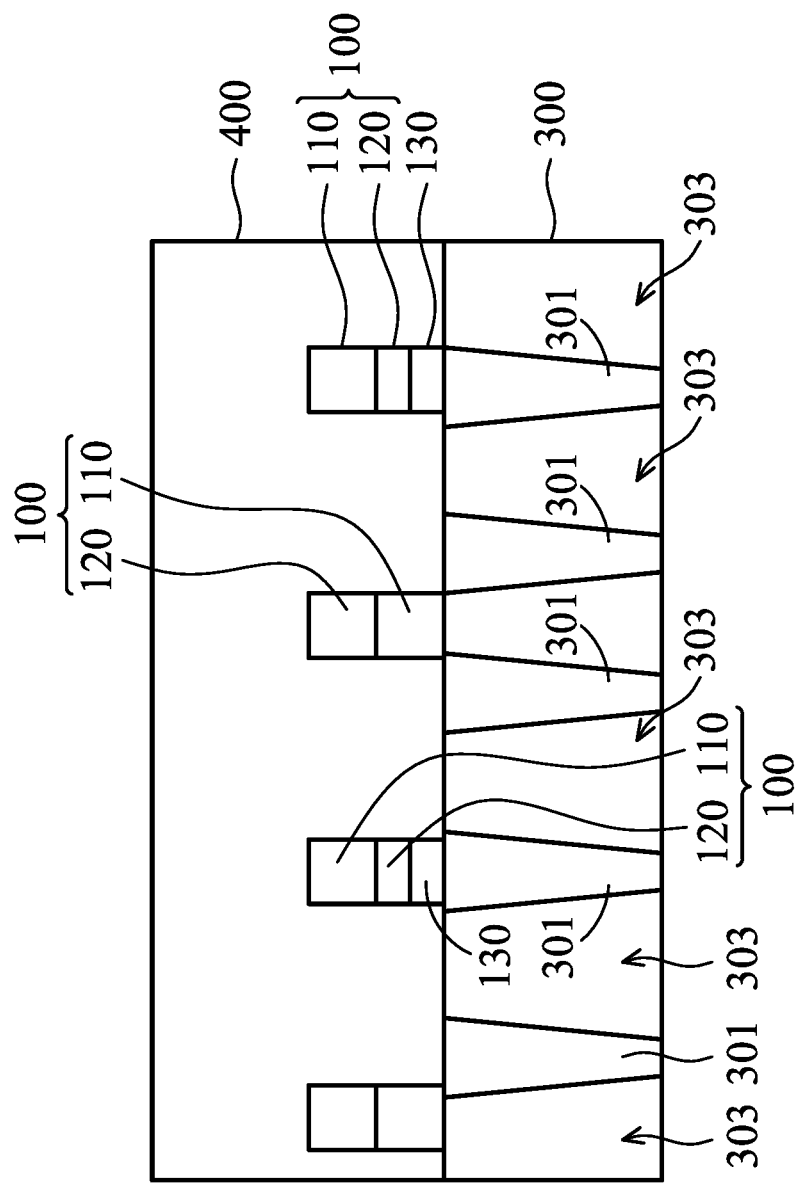
FIGS. 4A-4M are cross-sectional views illustrating various stages of manufacturing a semiconductor device in accordance with some embodiments of the present disclosure.
Figure 4B:
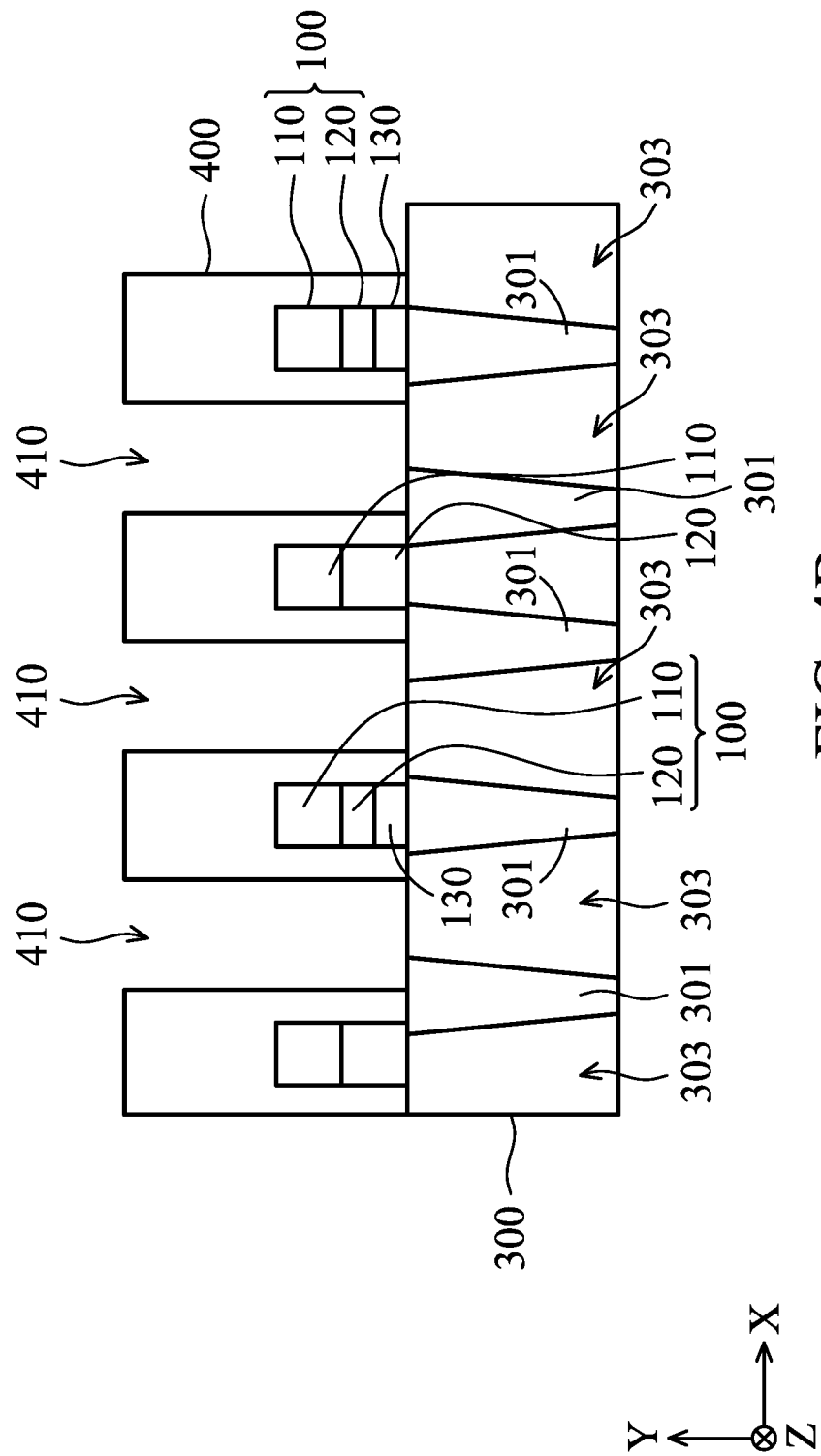

Please refer to FIG. 4B, trenches 410 are formed in the first dielectric layer 400 and between every two adjacent first conductive structures 110.

For example, a mask pattern (not shown) above the first dielectric layer 400 may be used as the etching mask to perform an etching process on the first dielectric layer 400, and the first dielectric layer 400 is etched until the surface of the substrate 300 is exposed to form the trenches 410.

Figure 4C:
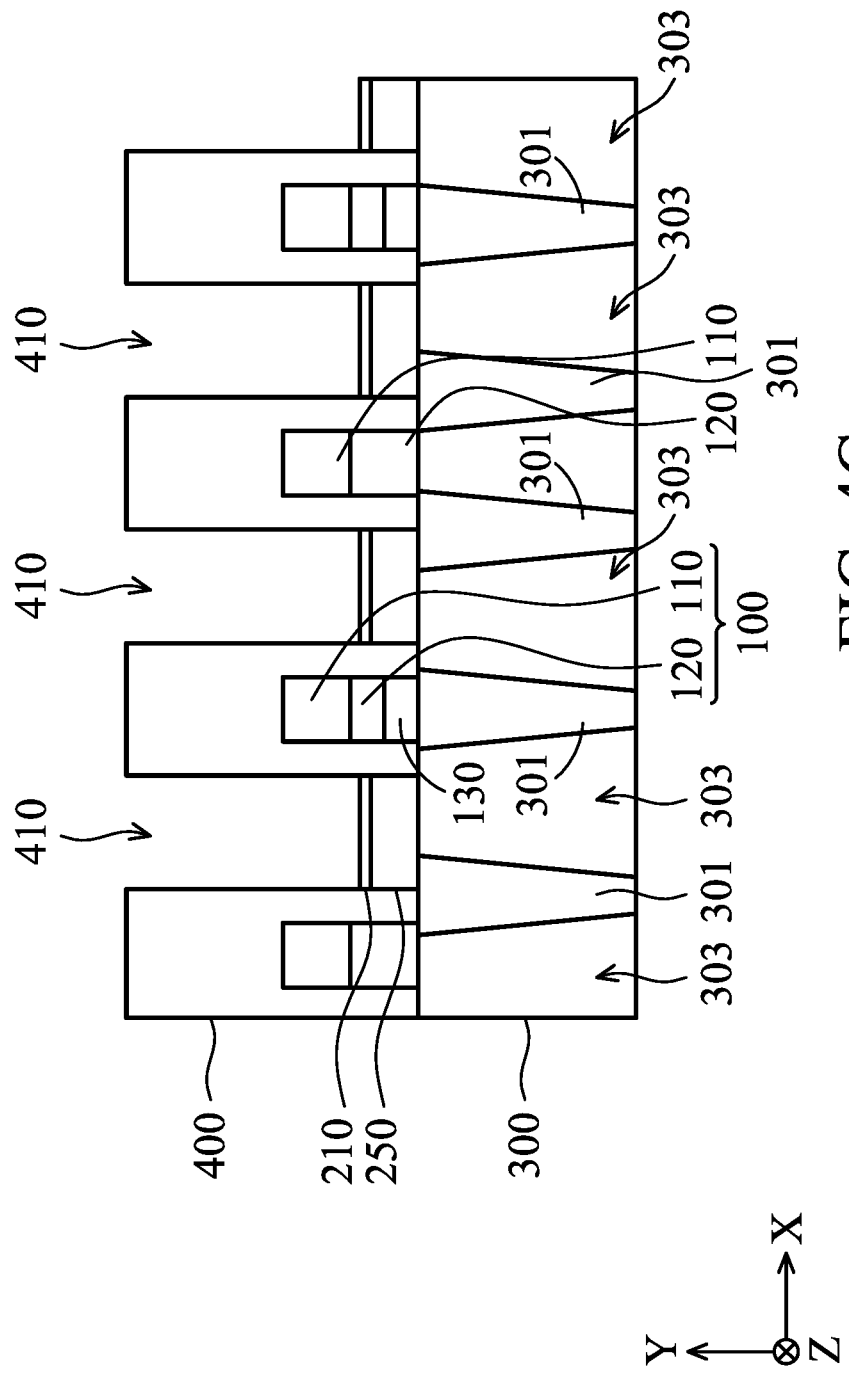

Please refer to FIG. 4C, conductive layers 250 and ohmic contact layers 210 are formed in the trenches 410, and the ohmic contact layers 210 are formed on the conductive layers 250.

In some embodiments, a metal layer may be formed on the top surfaces of the conductive layers 250, and the metal layer is formed by using physical deposition process (PVD) technique. Next, a silicide process is performed on the metal layer to form ohmic contact layers 210 including metal silicide.

In some embodiments, when the conductive layers 250 include silicon-containing materials (e.g., polysilicon), a high-temperature annealing process may be performed on the metal layer to silicide the metal layer so as to form metal silicide layers. In an embodiment, the metal layer may be a cobalt metal layer, and thus the metal silicide layers are cobalt silicide layers.

Figure 4D:
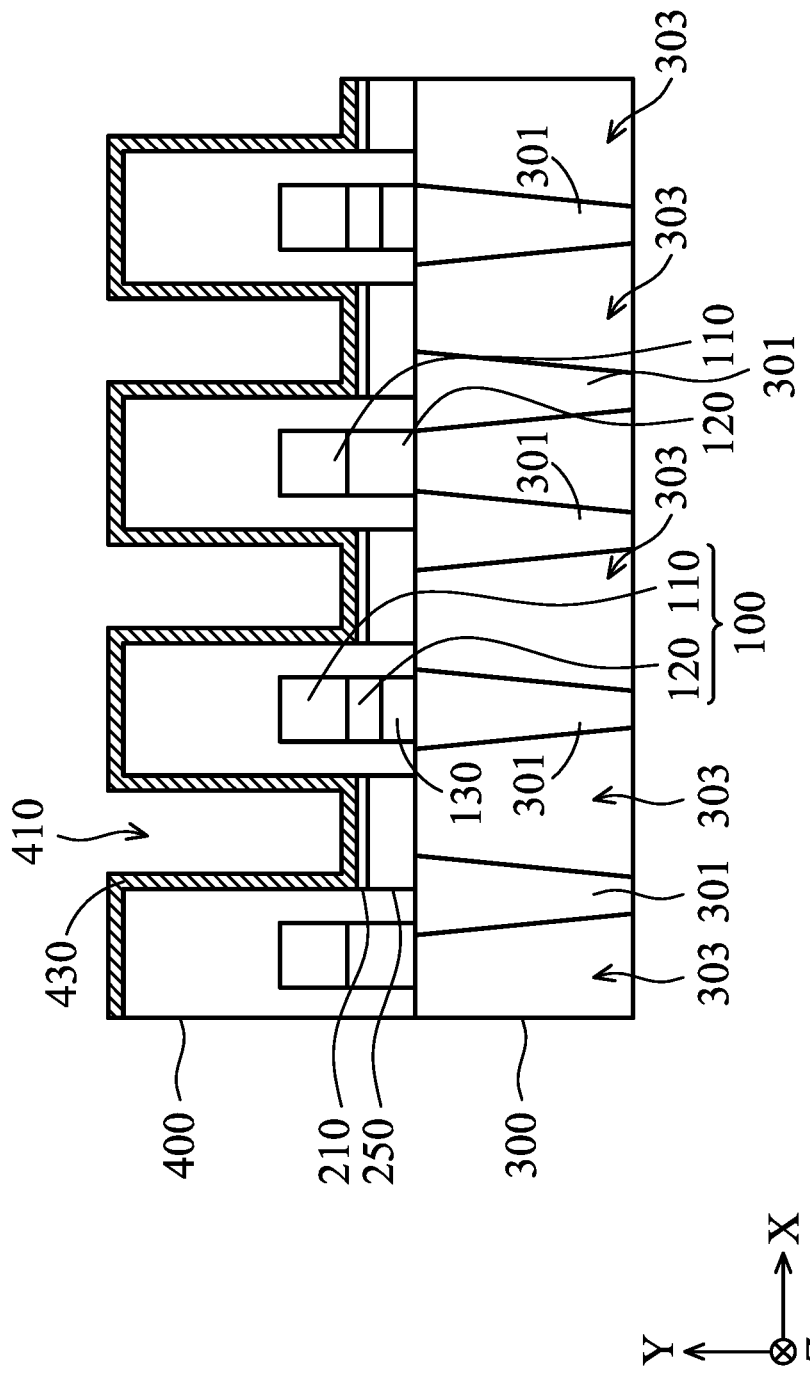

Please refer to FIG. 4D, a liner material 430 is formed on sidewalls and bottoms of the trenches 410 and on a top portion of the first dielectric layer 400. In some embodiments, the liner material 430 is, for example, a metal liner material, which may include metal or metal nitride. Please also refer to FIG. 1, the top-view shape of the trench 410 is similar to the top-view shape of the second conductive structure 200, thus the trench 410 has a surrounding integral sidewall. The liner material 430 may be formed on, for example, the entire sidewall and bottom inside the trench 410 as well as the top portion of the first dielectric layer 400.

Figure 4E:
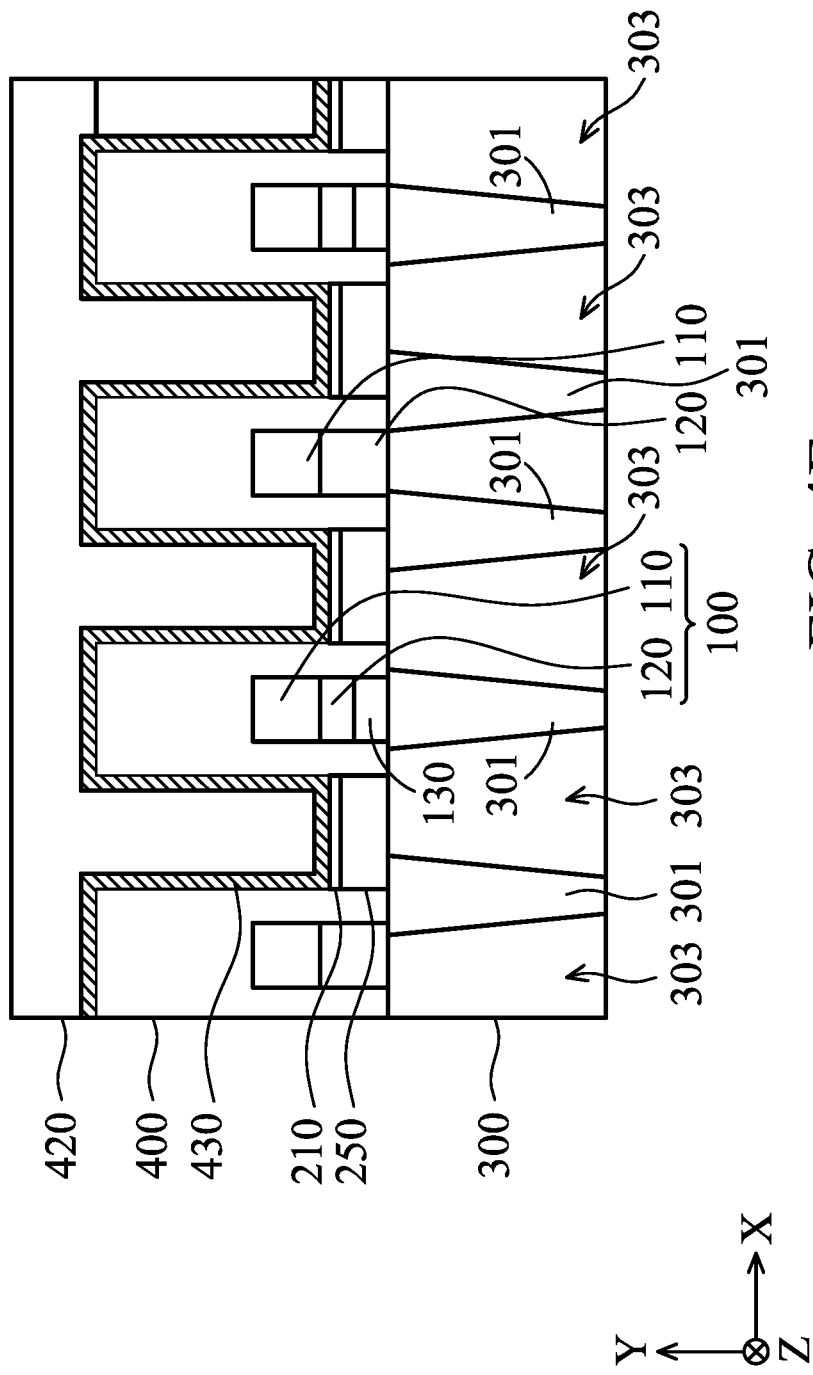

Please refer to FIG. 4E, a metal material 420 is deposited on the liner material 430 in the trenches 410 to fill the trenches 410 and cover the top surface of the first dielectric layer 400.

Figure 4F:
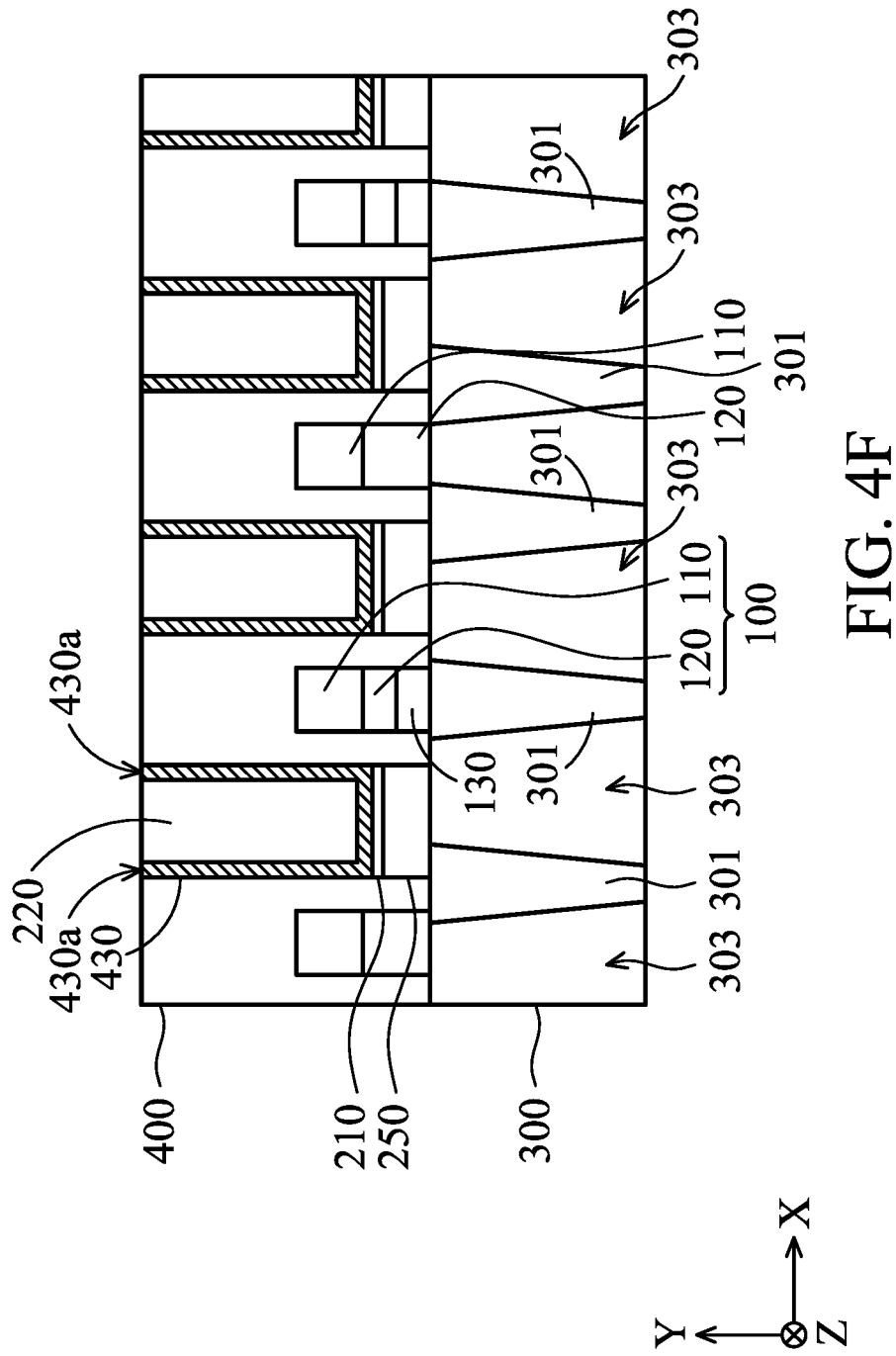

Please refer to FIG. 4F, a planarization process, for example, a chemical mechanical polishing process, is performed on the metal material 420 to remove the metal material 420 on the top surface of the first dielectric layer 400, and the metal material 420 that remains on the liner material 430 in the trenches 410 form the conductive plugs 220. The liner material 430 is in direct contact with the conductive plugs 220. Since the liner material 430 includes titanium, titanium nitride, tantalum, tantalum nitride, or any combinations thereof, the liner material 430 is advantageous to the deposition growth of the metal material 420 and enhances the adhesion of the conductive plugs 220 formed subsequently. Therefore, peeling of conductive plugs 220 is less likely to occur, and thus the stability of the semiconductor device can be improved.

Figure 4G:
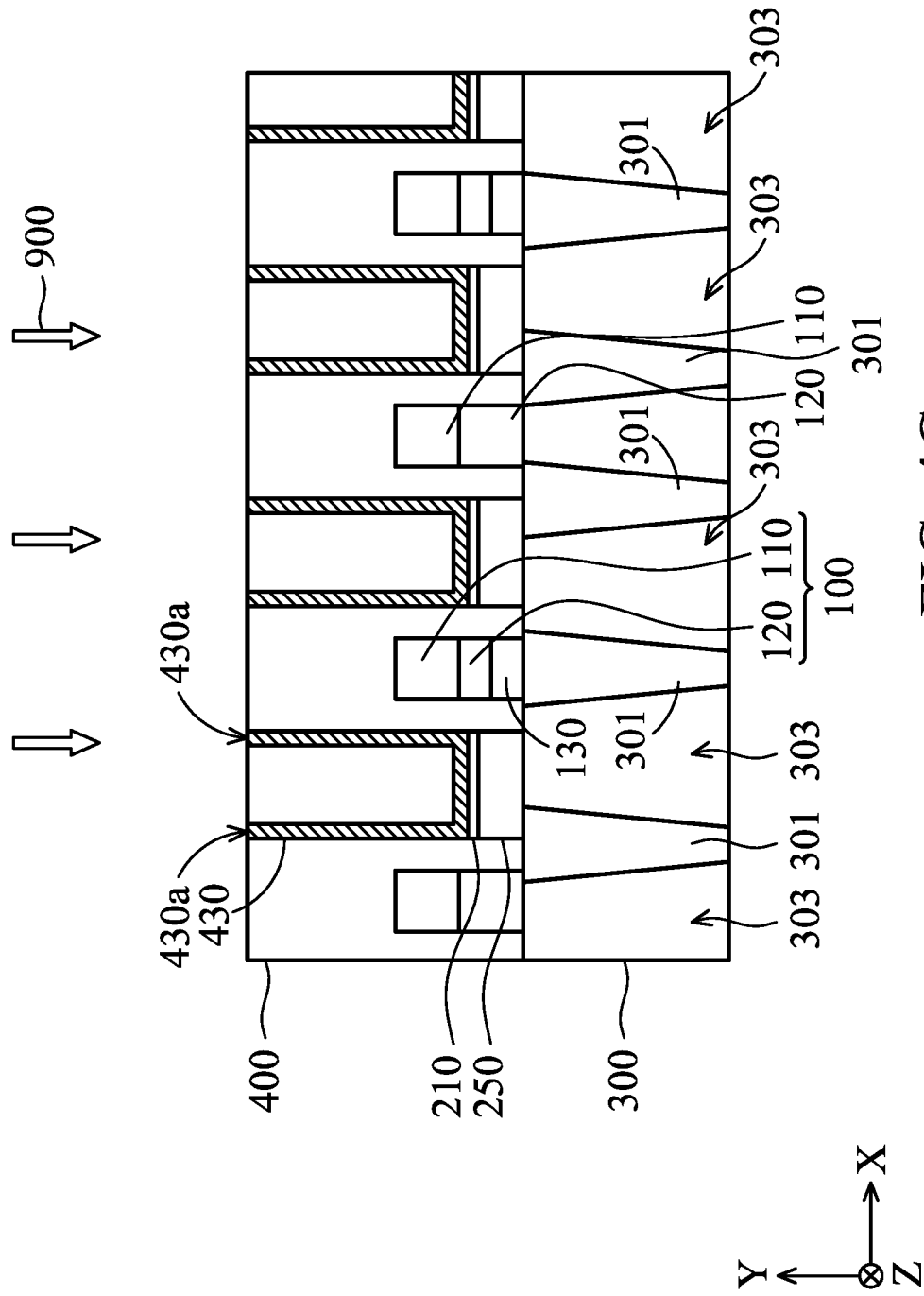
Figure 4H:
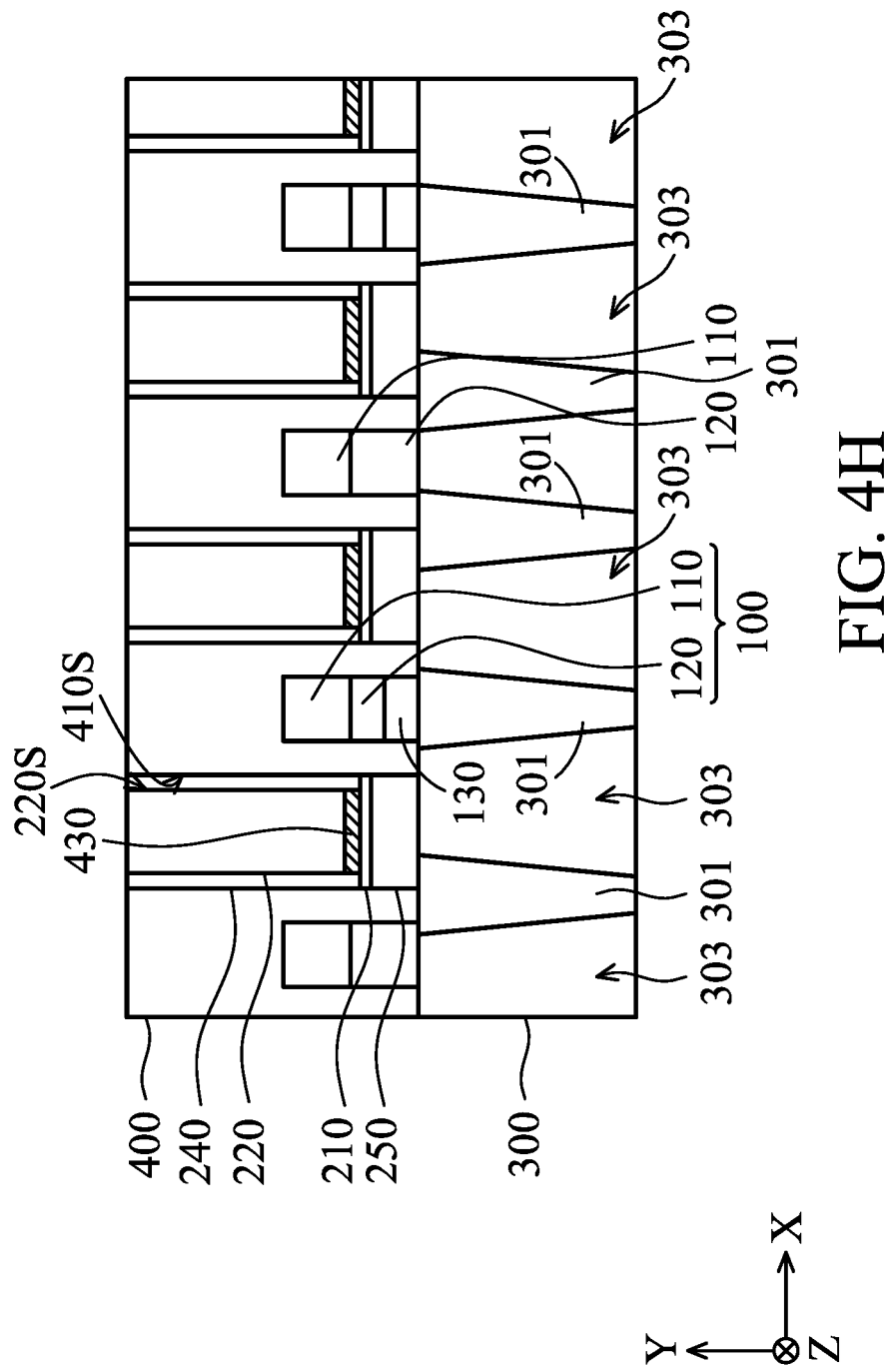

Please refer to FIGS. 4G and 4H, a dry etch process 900 may be performed to remove the liner material 430 to form air gaps 240, and the as-formed air gaps 240 are located between the conductive plugs 220 and the first dielectric layer 400. In some embodiments, the dry etch process 900 may include a gaseous etching process or a plasma etching process. According to the embodiments of the present disclosure, adopting a dry etch process having a high selectivity can remove the liner material 430 to form the air gaps 240 while only minimally damaging or even without damaging the structures of the first dielectric layer 400 and the conductive plugs 220.

Please refer to FIG. 4H, the liner material 430 is etched from an exposed top surface 430a of the liner material 430 towards the substrate 300 to remove the liner material 430, so as to form the air gaps 240.

According to the embodiments of the present disclosure, the liner material 430 is formed first, and thus peeling of the conductive plugs 220 can be prevented advantageously. The liner material 430 is then removed to form the air gaps 240, such that the air gaps 240 can be used to effectively reduce the parasitic capacitance $C_{BL}$ formed between the second conductive structure 200 and the adjacent first conductive structures 100. As a result, the space in which the liner material 430 is originally formed is used to form the air gaps 240, and the air gaps 240 replace the arranging position and the device volume of the original liner material 430. Accordingly, while additional device volume is not required for forming air gaps, the improvement of the formation and growth of the conductive plugs 220 in the manufacturing process as well as the reduction of the parasitic capacitance in the semiconductor device can be both achieved.

Furthermore, according to the embodiments of the present disclosure, the space in which the liner material 430 originally is formed is used to form the air gaps 240, such that extra components, other than metal liners, are not required to be disposed around the conductive plugs 220 (e.g., an extra sacrificial layer is formed in the trenches 430, followed by removing the sacrificial layer to form air gaps). Therefore, filling volume of the metal material 420 does not need to be sacrificed due to disposing extra components, thereby the as-formed conductive plugs 220 can have relatively large volumes, and better conductive properties of the conductive plugs 220 can be further maintained.

In addition, if extra components, in addition to metal liners, are disposed in the trenches 410 before filling the metal material 420, the cross-sectional sizes of the trenches 410, which are supposed to be filled with the metal material 420, will be reduced. As such, the trenches 410 may have larger aspect ratios, and this may cause incomplete filling of the metal material 420 so as to form voids or seams within the as-formed conductive plugs 220. According to the embodiments of the present disclosure, it is not required to reduce the predetermined cross-sectional sizes of the conductive plugs 220 in order to form the air gaps, such that poor filling of the metal material 420 can be prevented, and effects of forming the conductive plugs 220 having good filling properties and good conductivity can be achieved.

In some embodiments, performing the dry etch process 900 can remove the liner material 430 until the ohmic contact layers 210 are exposed, and the as-formed air gaps 240 surround and cover the sidewalls of the conductive plugs 220. In addition, the air gaps 240 may be directly connected to the ohmic contact layers 210, and a portion of the liner material 430 below the conductive plugs 220 is not removed by the dry etch process 900.

In some embodiments, after the liner material 430 is removed, the sidewalls 410S of the trenches 410 and the sidewalls 220S of the conductive plugs 220 are exposed. The sidewalls 410S of the trenches 410 are formed of the first dielectric layer 400.

Figure 4I:
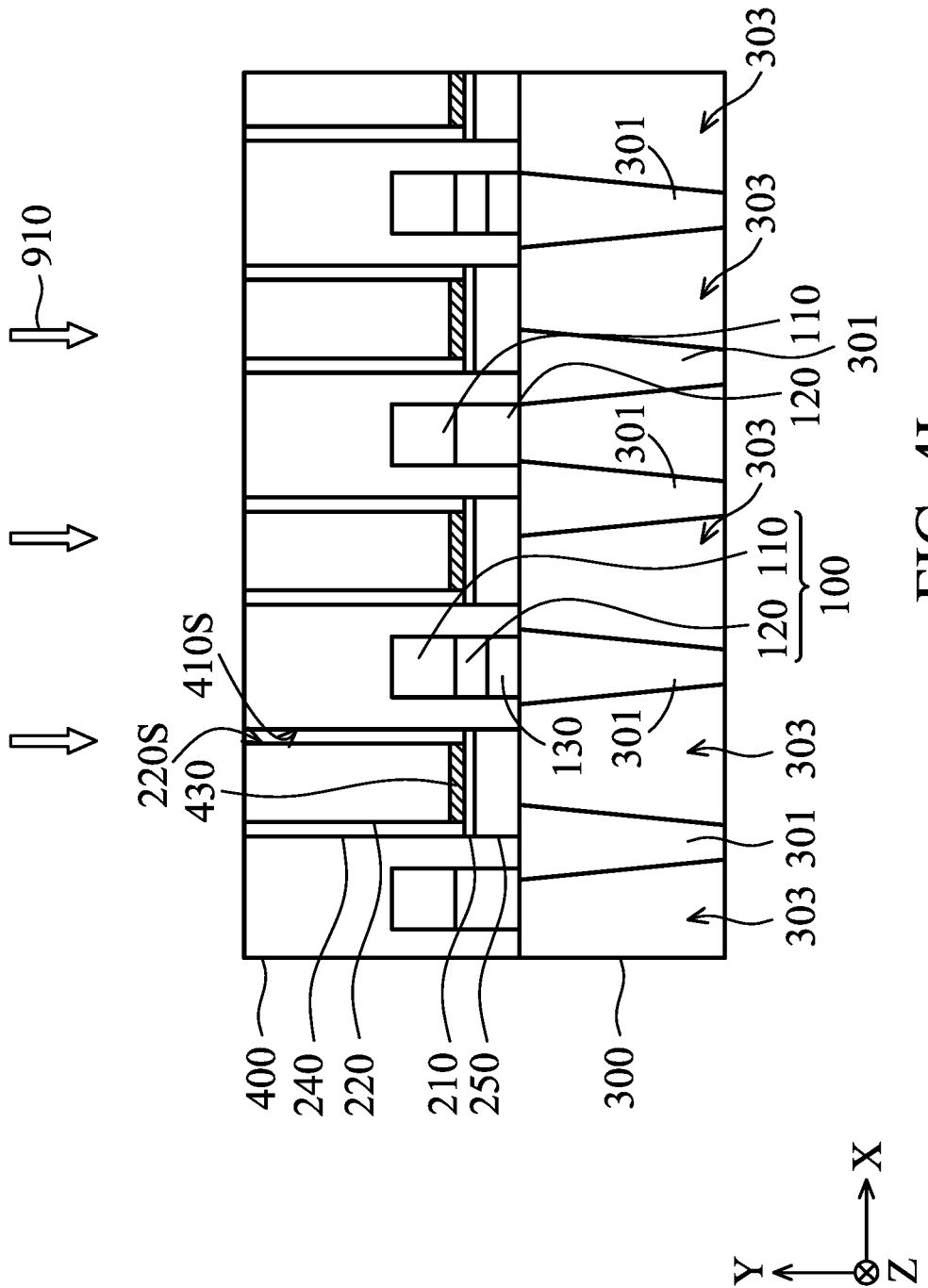

Please refer to FIG. 4I, a post-etch cleaning process 910 is performed on the sidewalls 410S of the trenches 410 and the sidewalls 220S of the conductive plugs 220.

Figure 4J:
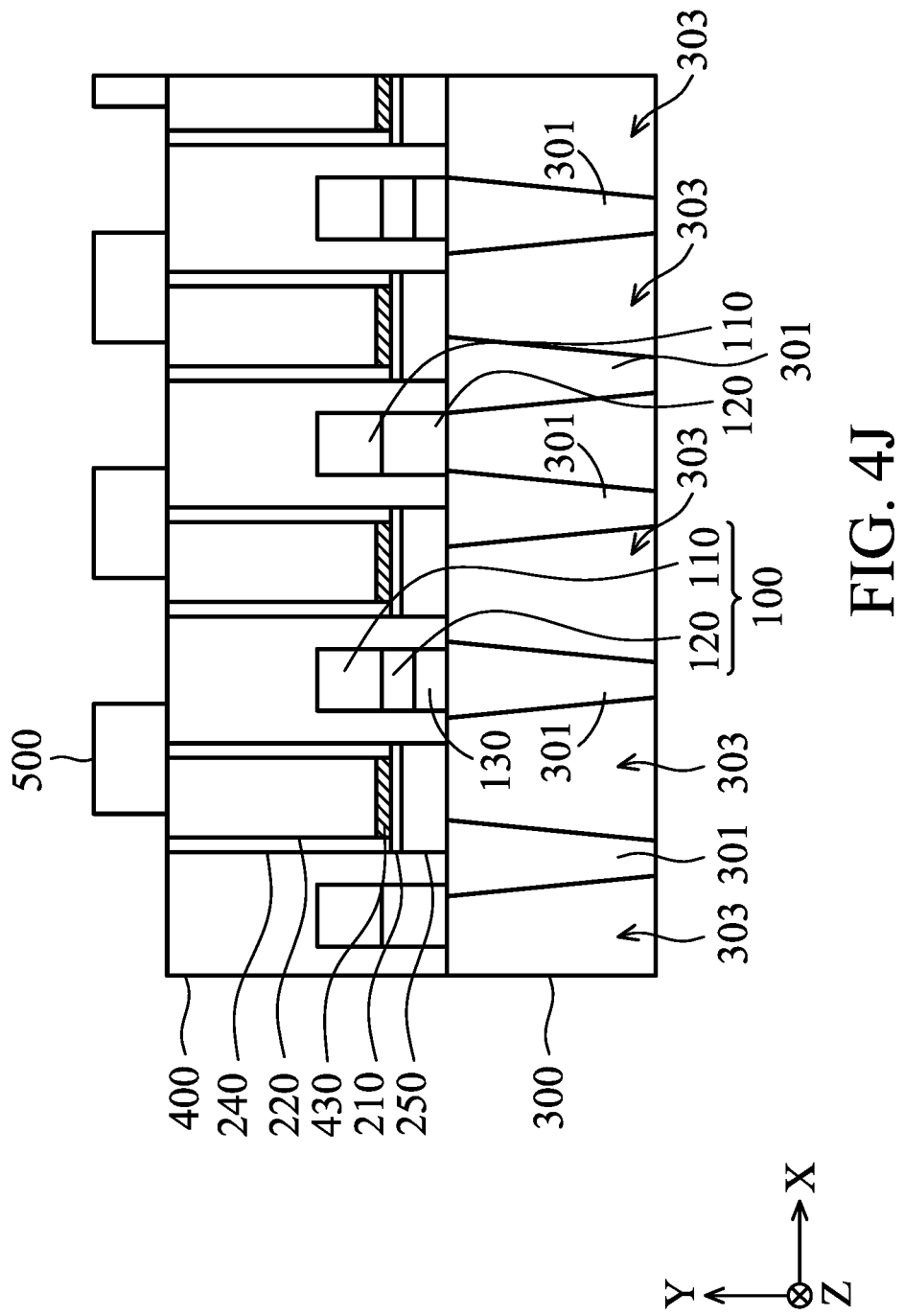

Please refer to FIG. 4J, conductive connection layers 500 are formed on the conductive plugs 220 and the air gaps 240. For example, a full layer of conductive material (not shown) is first formed on the top surface of the first dielectric layer 400, the top surfaces of the conductive plugs 220, and the air gaps 240, and then a patterning process is performed on the layer of conductive material to form the conductive connection layers 500. Each of the conductive connection layers 500 is respectively and correspondingly disposed on one of the conductive plugs 220 and one of the air gaps 240 adjacent to the sidewall 220S of the conductive plugs 220.

Figure 4K:
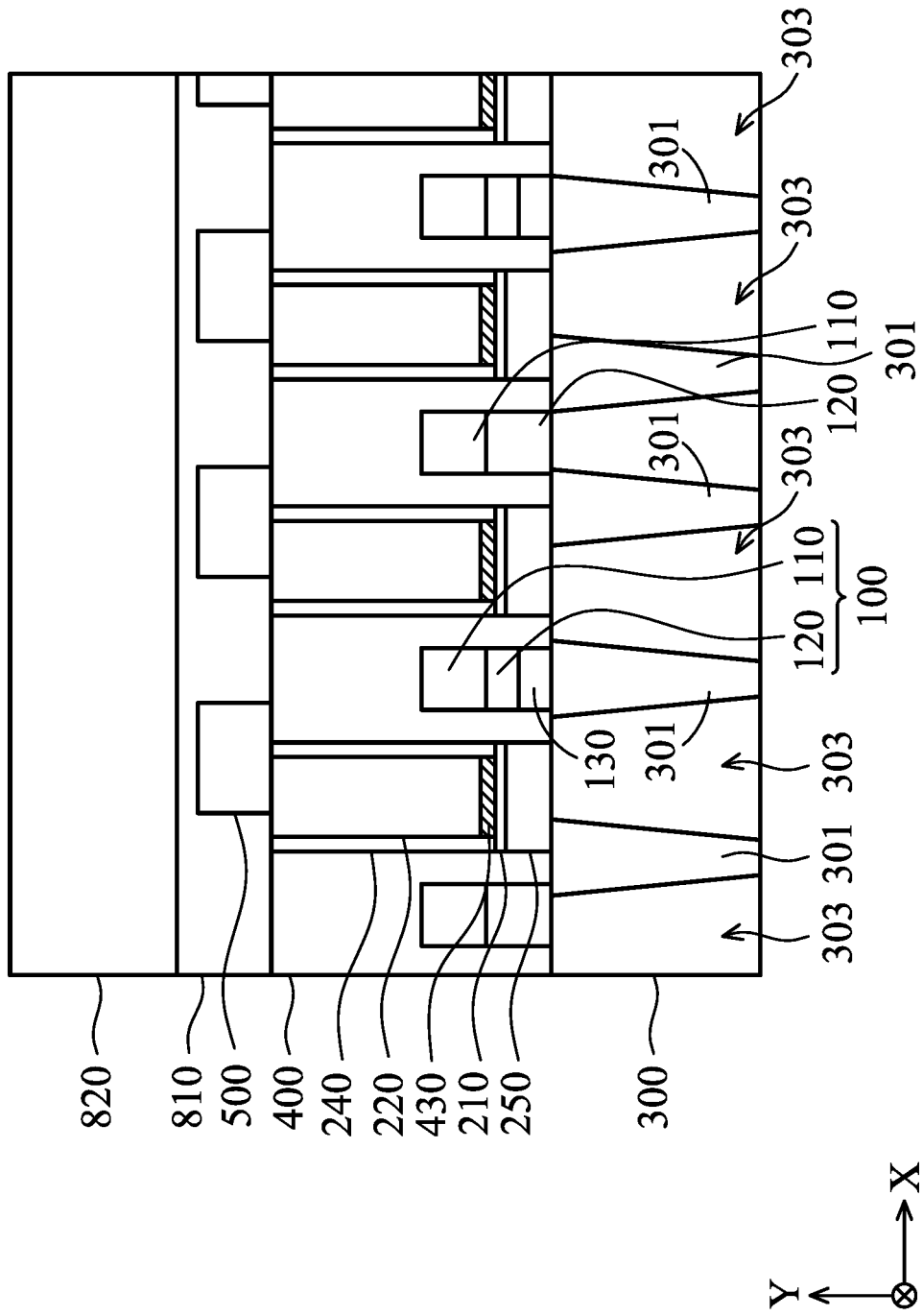

Please refer to FIG. 4K, a dielectric layer 810 is formed on the conductive connection layers 500. The dielectric layer 800 covers the conductive connection layers 500 and the top surface of the first dielectric layer 400. Then, a dielectric layer 820 is formed on the dielectric layer 810. The dielectric layer 810 and the dielectric layer 820 form a second dielectric layer 800. In some embodiments, the dielectric layer 810 includes such as silicon nitride, and the dielectric layer 820 includes such as silicon oxide. The dielectric layer 810 (silicon nitride layer) surrounds the conductive connection layers 500 and covers the top surface of the first dielectric layer 400 to provide etching stop effects. As such, etchants (e.g., hydrofluoric acid or other similar strong acids) of etching processes unexpectedly penetrating through the conductive connection layers 500 and damaging the first dielectric layer 400 or even other films and/or components thereunder can be prevented. In addition, the process window of etching processes can be enlarged.

Figure 4L:
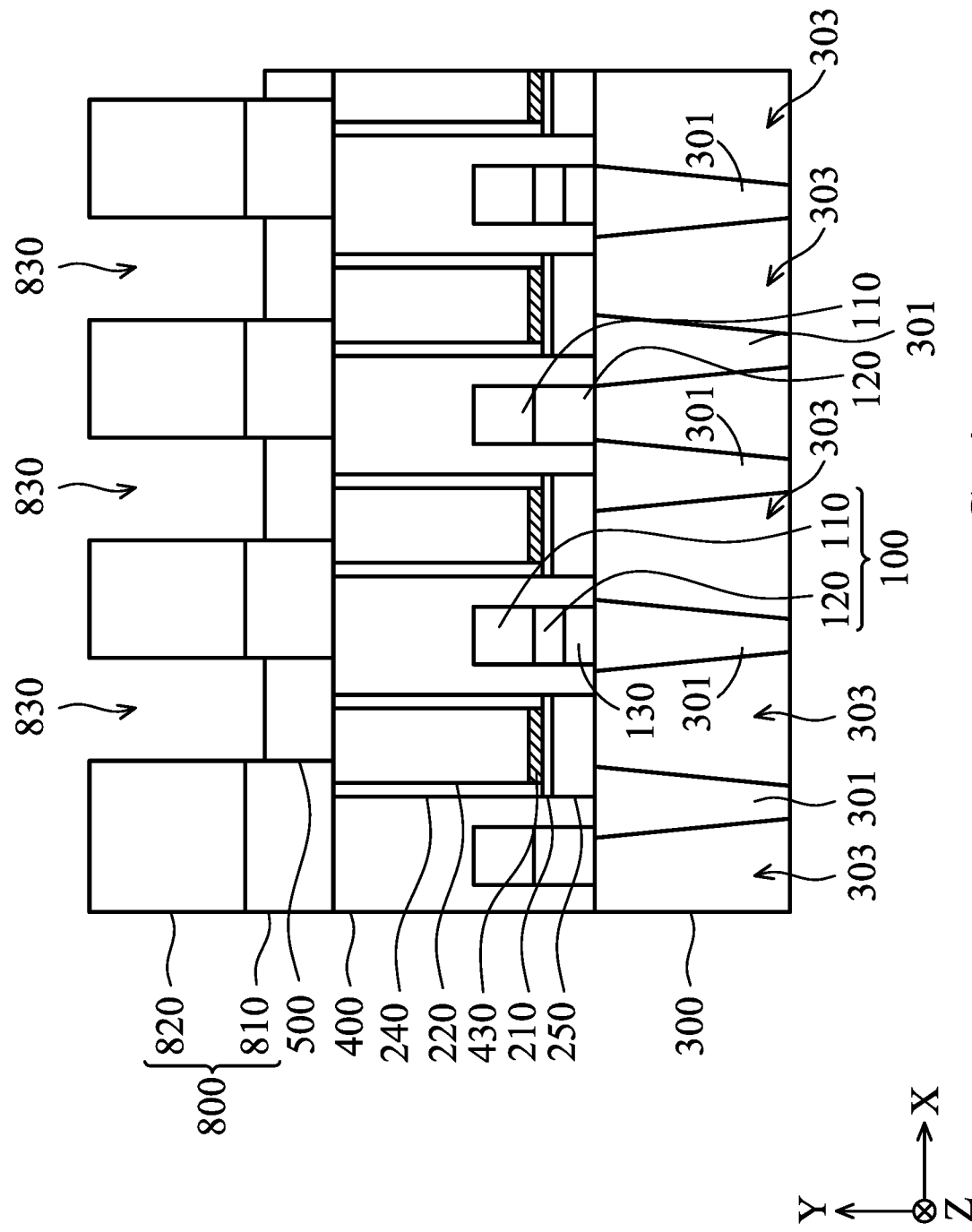

Please refer to FIG. 4L, trenches 830 are formed in the second dielectric layer 800 and corresponding to the conductive connection layers 500. For example, a mask pattern (not shown) above the second dielectric layer 800 may be used as the etching mask to perform an etching process on the second dielectric layer 800, and the second dielectric layer 800 is etched until the surfaces of the conductive connection layers 500 are exposed to form the trenches 830.

Figure 4M:
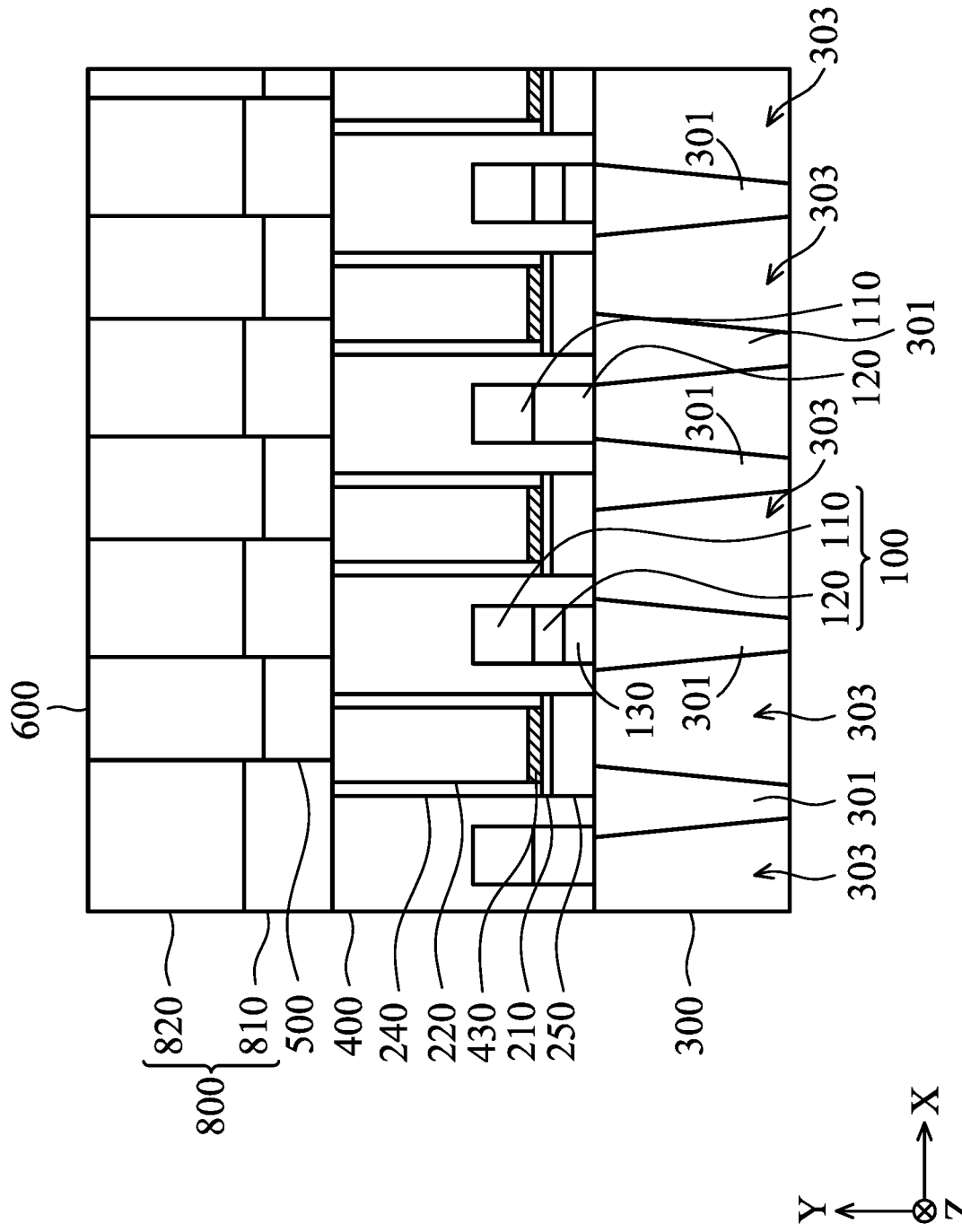

Please refer to FIG. 4M, capacitor components 600 are formed in the trenches 830. As such, the semiconductor device 20 as shown in FIG. 3 is formed.

Figure 5A:
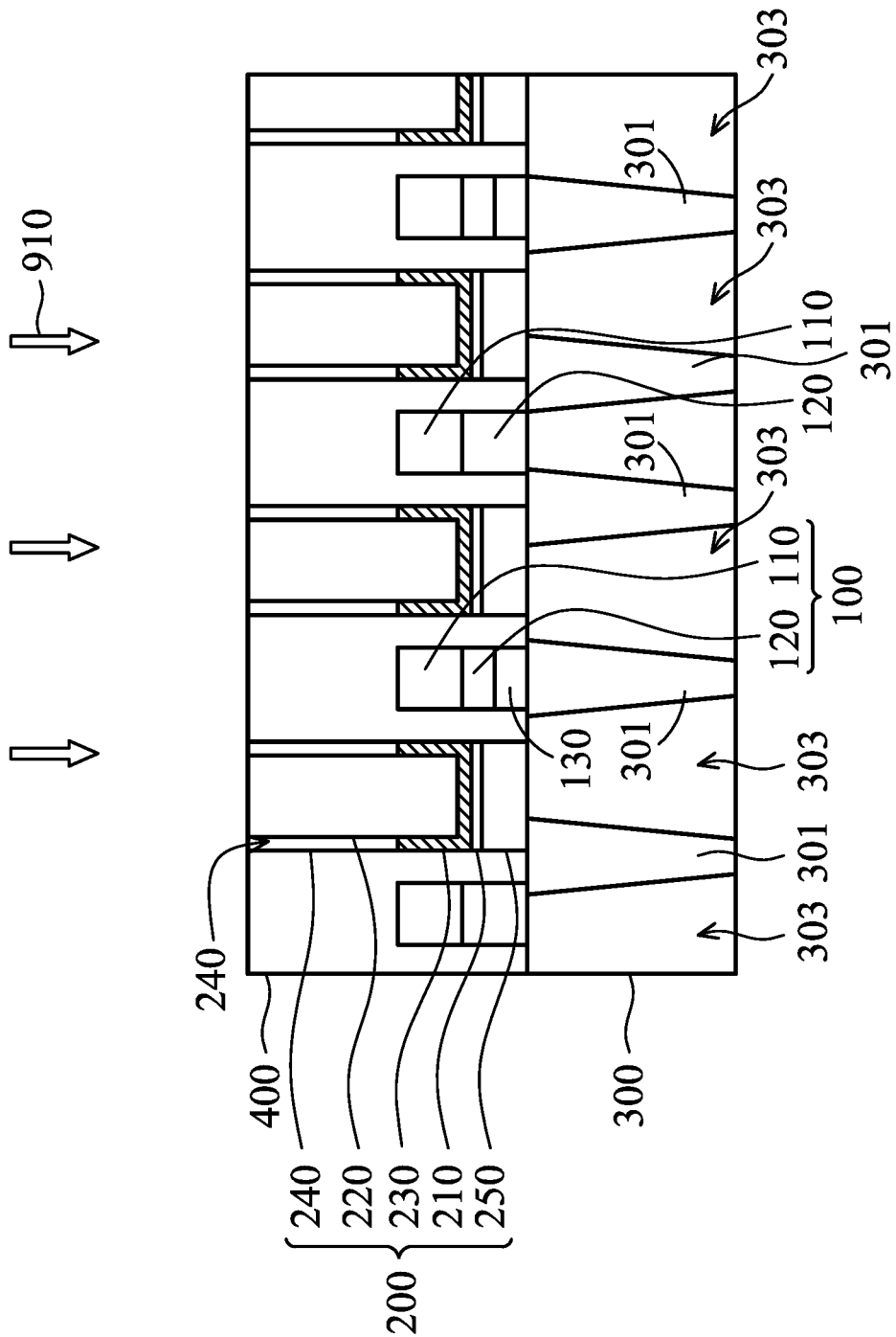
FIGS. 5A-5B are cross-sectional views illustrating various stages of manufacturing a semiconductor device in accordance with some other embodiments of the present disclosure.
Figure 5B:
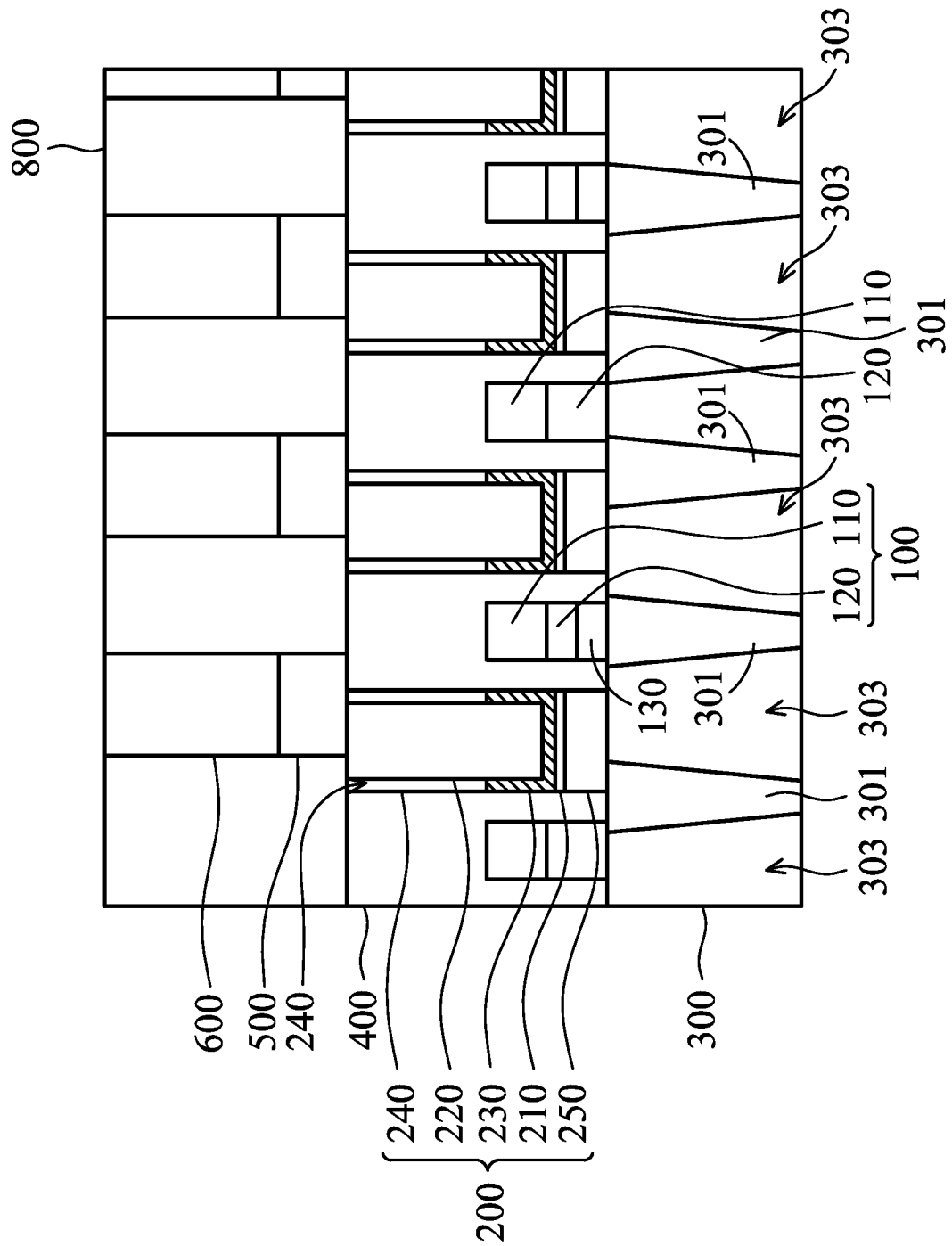

FIGS. 5A-5B are cross-sectional views illustrating various stages of manufacturing a semiconductor device in accordance with some other embodiments of the present disclosure. Please also refer to FIGS. 4A to 4G and FIGS. 4J to 4M. Except for those indicated otherwise, components in the following embodiments similar to those in previous embodiments adopt the same reference numbers, and may be formed of similar materials and by similar processes, thus the detailed are not repeated herein.

First, processes as illustrated in FIGS. 4A to 4G are performed to form the structure as shown in FIG. 4G. The details of the processes are as afore-mentioned, and the details are not repeated.

Next, please refer to FIG. 4G and FIG. 5A, a dry etch process 900 is performed to etch the liner material 430 from the exposed top surface 430a of the liner material 430 towards the substrate 300 to partially remove the liner material 430, so as to form the air gaps 240 and the metal liner layers 230 below the air gaps 240. The metal liner layers 230 are located on the ohmic contact layers 210, and the metal liner layers 230 are located between the ohmic contact layers 210 and the air gaps 240. After the metal liner layers 230 are formed, a post-etch cleaning process 910 is performed on the sidewalls of the trenches 410 and the sidewalls of the conductive plugs 220.

Next, please refer to FIGS. 4J to 4M and FIG. 5B, conductive connection layers 500 are formed on the conductive plugs 220 and the air gaps 240, and capacitor components 600 are formed on the conductive connection layers 500. In addition, the second dielectric layer 800 is formed, and the conductive connection layers 500 and the capacitor components 600 are located in the second dielectric layer 800. As such, the semiconductor device 10 as shown in FIGS. 1 and 2 is formed.

Although the present disclosure has been described above by various embodiments, these embodiments are not intended to limit the disclosure. Those skilled in the art should appreciate that they may make various changes, substitutions and alterations on the basis of the embodiments of the present disclosure to realize the same purposes and/or advantages as the various embodiments described herein. Those skilled in the art should also appreciate that the present disclosure may be practiced without departing from the spirit and scope of the disclosure. Therefore, the scope of protection of the present disclosure is defined as the subject matter set forth in the appended claims.

What is claimed is:

1. A manufacturing method of a semiconductor device, comprising:

forming a first dielectric layer and a plurality of first conductive structures on a substrate, wherein the first dielectric layer is located between the first conductive structures;

forming a trench in the first dielectric layer and between the first conductive structures;

forming an ohmic contact layer in the trench;

forming a liner material to cover the ohmic contact layer and a sidewall of the trench;

forming a conductive plug on the liner material in the trench; and etching the liner material from an exposed top surface of the liner material towards the substrate to partially remove the liner material, so as to form an air gap and a liner layer, wherein the air gap is located between the conductive plug and the first dielectric layer, and the liner layer has a horizontal portion located between the conductive plug and the ohmic contact layer.

2. The manufacturing method of the semiconductor device as claimed in claim 1, wherein the liner material comprises metal or metal nitride, and the conductive plug comprises metal.

3. The manufacturing method of the semiconductor device as claimed in claim 1, wherein the liner material is in direct contact with the conductive plug.

4. The manufacturing method of the semiconductor device as claimed in claim 1, wherein the liner material is etched by performing a dry etch process.

5. The manufacturing method of the semiconductor device as claimed in claim 1, wherein the liner layer is located between the ohmic contact layer and the air gap.

6. The manufacturing method of the semiconductor device as claimed in claim 1, further comprising:

forming a conductive connection layer on the conductive plug and the air gap after etching the liner material from the exposed top surface of the liner material towards the substrate to partially remove the liner material to form the air gap and the liner layer; and forming a capacitor component on the conductive connection layer.

7. A semiconductor device, comprising:

a plurality of first conductive structures disposed on a substrate; and a second conductive structure disposed on the substrate and located between the first conductive structures, wherein the second conductive structure comprises:

an ohmic contact layer;

a conductive plug located on the ohmic contact layer;

an air gap located on the ohmic contact layer and on a sidewall of the conductive plug; and a metal liner layer located between the ohmic contact layer and the air gap and located on the sidewall of the conductive plug, wherein the metal liner layer has a horizontal portion located between the conductive plug and the ohmic contact layer.

8. The semiconductor device as claimed in claim 7, further comprising:

a first dielectric layer disposed on the substrate and located between the first conductive structures and the second conductive structure, wherein the air gap is located between the conductive plug and the first dielectric layer.

9. The semiconductor device as claimed in claim 8, further comprising:

a conductive connection layer disposed on the conductive plug and the air gap; and a capacitor component disposed on the conductive connection layer.

10. The semiconductor device as claimed in claim 7, wherein the metal liner layer comprises metal or metal nitride, and the conductive plug comprises metal.

11. The semiconductor device as claimed in claim 7, wherein the metal liner layer has a vertical portion disposed directly below the air gap.

12. The semiconductor device as claimed in claim 9, wherein the conductive connection layer is in direct contact with a top surface of the first dielectric layer and a top surface of the conductive plug.

13. The manufacturing method of the semiconductor device as claimed in claim 1, wherein the liner layer has a vertical portion disposed directly below the air gap.

14. The manufacturing method of the semiconductor device as claimed in claim 6, wherein the conductive connection layer is in direct contact with a top surface of the first dielectric layer and a top surface of the conductive plug.

15. The manufacturing method of the semiconductor device as claimed in claim 14, wherein a bottom surface of the conductive connection layer, the top surface of the first dielectric layer, and the top surface of the conductive plug are coplanar.

16. The manufacturing method of the semiconductor device as claimed in claim 1, wherein the liner material is etched to expose the ohmic contact layer, and a width of the horizontal portion of the liner layer is equal to a width of the conductive plug.

17. A manufacturing method of a semiconductor device, comprising:

forming a first dielectric layer and a plurality of first conductive structures on a substrate, wherein the first dielectric layer has a first portion located between the first conductive structures and a second portion covering the first conductive structures;

forming a trench in the first portion and remaining the second portion on top surfaces of the first conductive structures;

forming a liner material on a sidewall and a bottom of the trench;

forming a conductive plug on the liner material in the trench, wherein a top surface of the conductive plug and a top surface of the second portion are coplanar; and etching the liner material from an exposed top surface of the liner material towards the substrate to partially remove the liner material, so as to form an air gap and a liner layer below the air gap, wherein the air gap is located between the conductive plug and the first dielectric layer, and the liner layer has a horizontal portion located between the conductive plug and the substrate.

18. The manufacturing method of the semiconductor device as claimed in claim 17, wherein before forming the liner material on the sidewall of the trench, the manufacturing method of the semiconductor device further comprises:

forming an ohmic contact layer in the trench, wherein the liner layer is located between the ohmic contact layer and the air gap.

19. The manufacturing method of the semiconductor device as claimed in claim 17, further comprising:

forming a conductive connection layer on the conductive plug and the air gap after etching the liner material from the exposed top surface of the liner material towards the substrate to partially remove the liner material to form the air gap and the liner layer; and forming a capacitor component on the conductive connection layer.

20. The manufacturing method of the semiconductor device as claimed in claim 17, wherein the liner layer has a vertical portion disposed directly below the air gap.

* * * * *